(12) United States Patent
Mulder et al.

(10) Patent No.: US 6,727,839 B2
(45) Date of Patent: Apr. 27, 2004

(54) HIGH SPEED, LOW POWER COMPARATOR

(75) Inventors: Jan Mulder, Houten (NL); Franciscus M. L. van der Goes, Den Haag (NL)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 10/226,165

(22) Filed: Aug. 23, 2002

(65) Prior Publication Data

US 2004/0036644 A1 Feb. 26, 2004

(51) Int. Cl.[7] .................................................. H03M 1/34
(52) U.S. Cl. ........................................ 341/165; 341/155
(58) Field of Search ........................ 341/110–172, 155, 341/165

(56) References Cited

U.S. PATENT DOCUMENTS

| | | | | |
|---|---|---|---|---|
| 4,092,955 A | * | 6/1978 | Reddy ........................ 123/436 |
| 4,417,317 A | * | 11/1983 | White et al. ................ 708/819 |
| 5,034,746 A | * | 7/1991 | Herbst et al. ............... 341/172 |
| 5,070,332 A | * | 12/1991 | Kaller et al. ................ 341/156 |
| 5,594,383 A | * | 1/1997 | Tamba ........................ 327/552 |
| 5,721,503 A | * | 2/1998 | Burns et al. ................ 327/199 |
| 5,748,132 A | * | 5/1998 | Matsuzawa ................. 341/156 |
| 6,072,416 A | | 6/2000 | Shima ........................ 341/159 |

OTHER PUBLICATIONS

Millman, Jacob, Ph.D and Grabel, Arvin, Sc.D., "Microelectronics", McGraw–Hill Book Company, 1987, pp. 719–726.

* cited by examiner

*Primary Examiner*—Michael Tokar
*Assistant Examiner*—Linh Van Nguyen
(74) *Attorney, Agent, or Firm*—Sterne, Kessler, Goldstein & Fox P.L.L.C.

(57) ABSTRACT

A method for reducing bit errors in an analog to digital converter having an array of comparators. The outputs of first and second comparators are received as in inputs to an Exclusive OR gate. The first and second comparators are separated in the array by a third comparator. The output of the Exclusive OR gate is used to determine if the third comparator is in a metastable condition. If the third comparator is in a metastable condition, the bias current of the latch circuit of the third comparator is increased to increase the rate at which the third comparator transitions to a steady state.

13 Claims, 10 Drawing Sheets

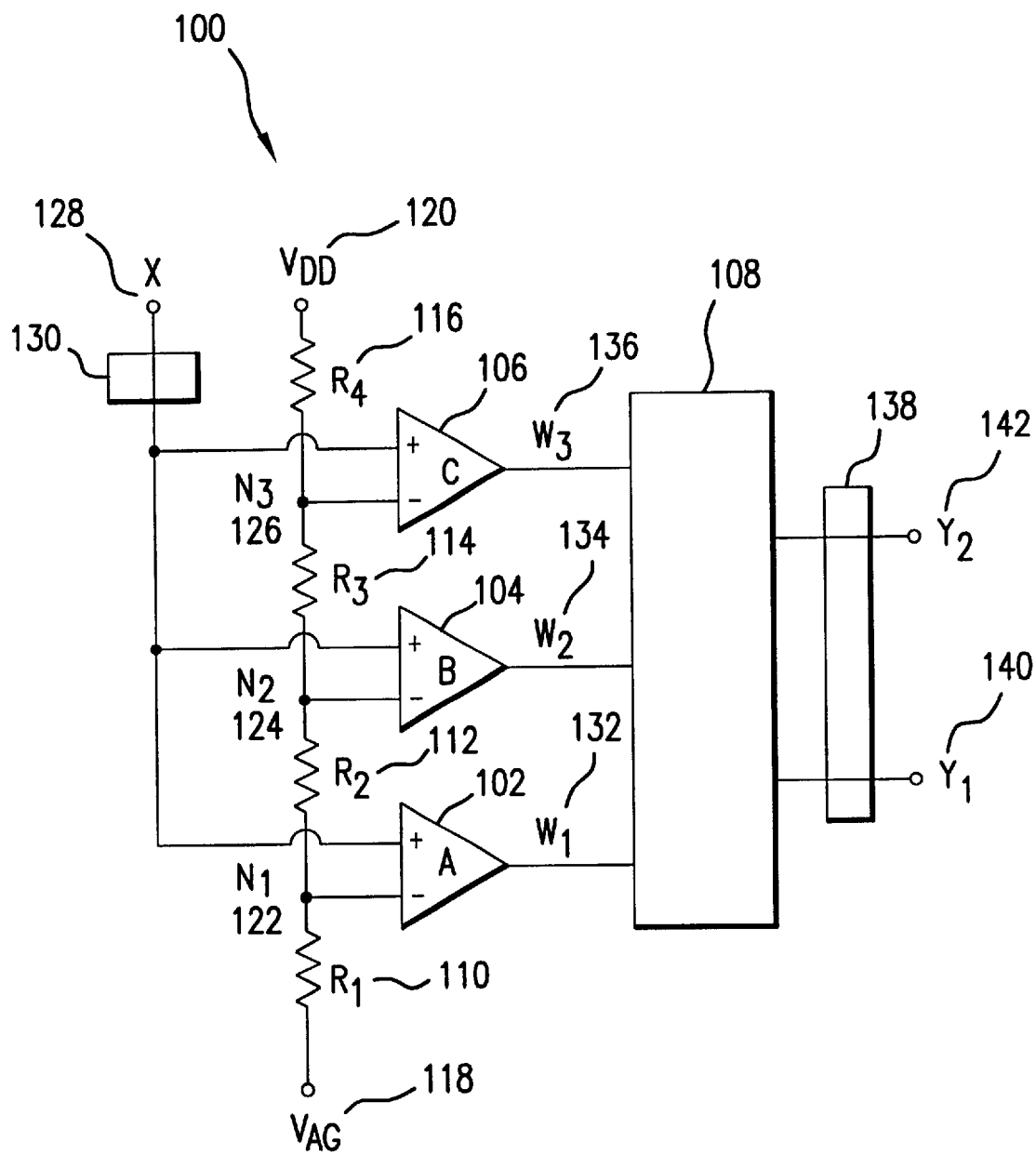
FIG.1
CONVENTIONAL

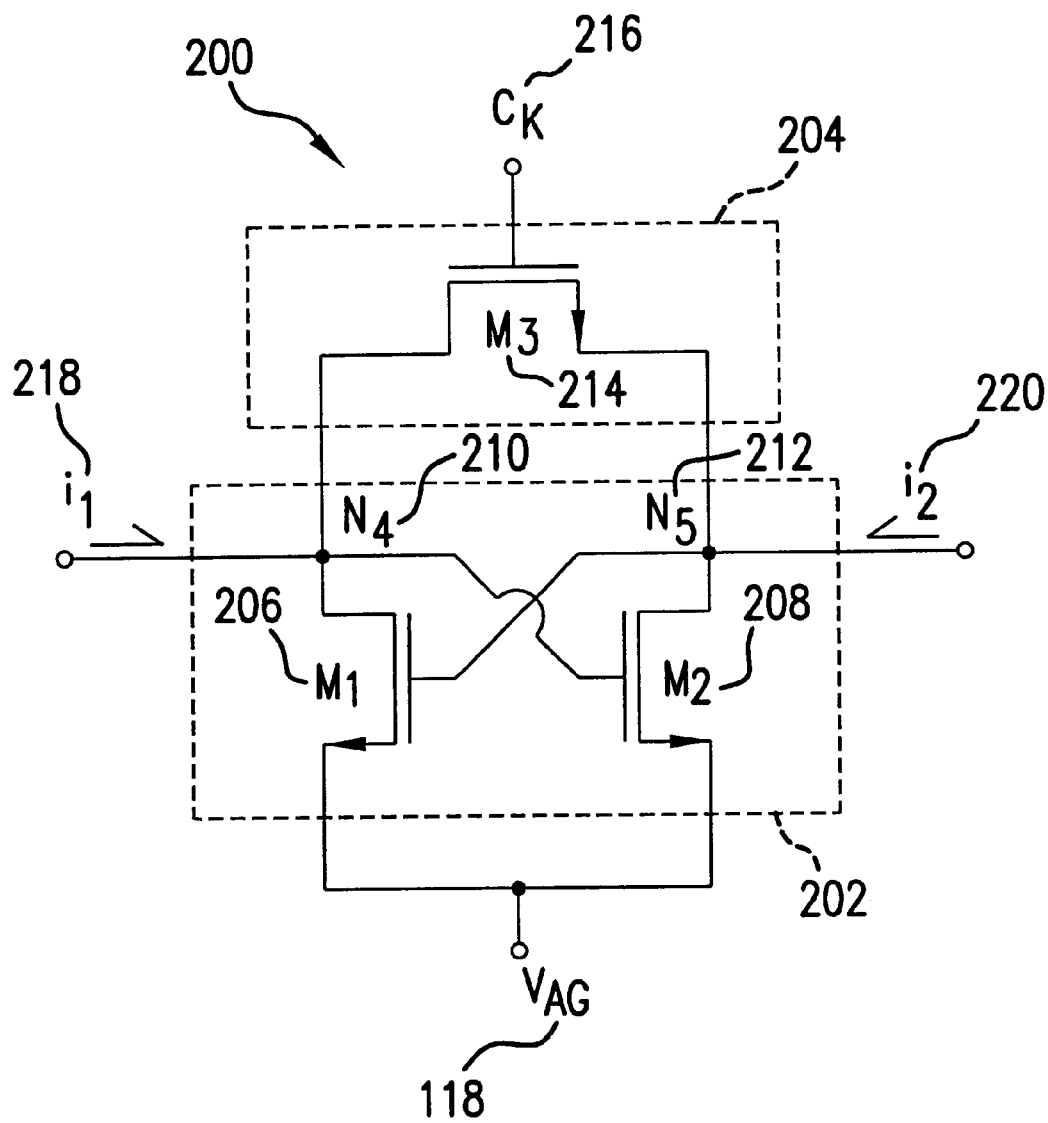
FIG. 2
CONVENTIONAL

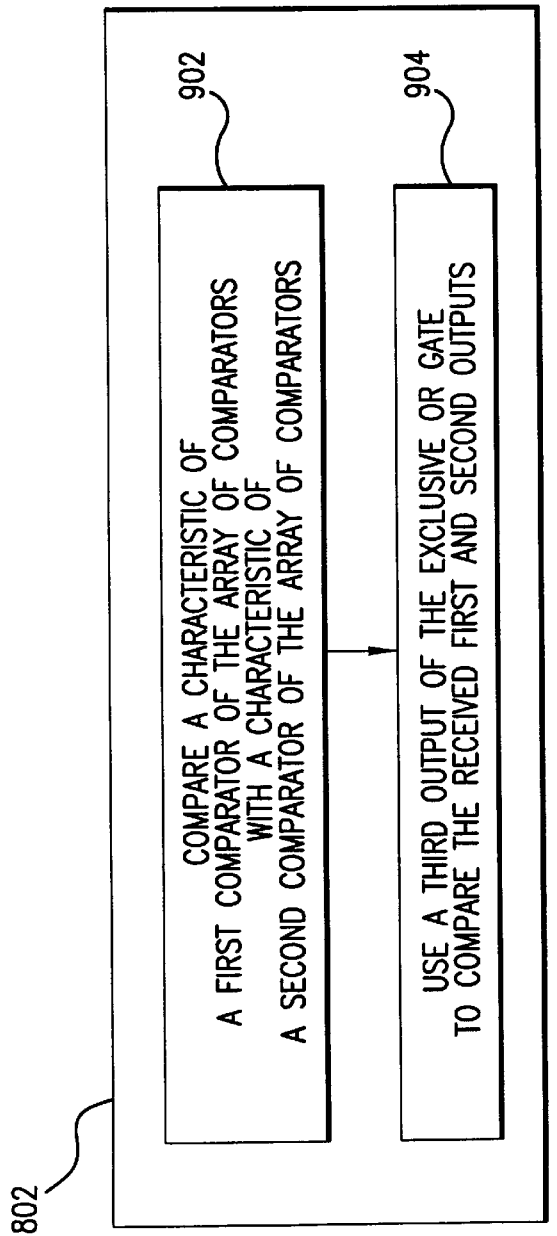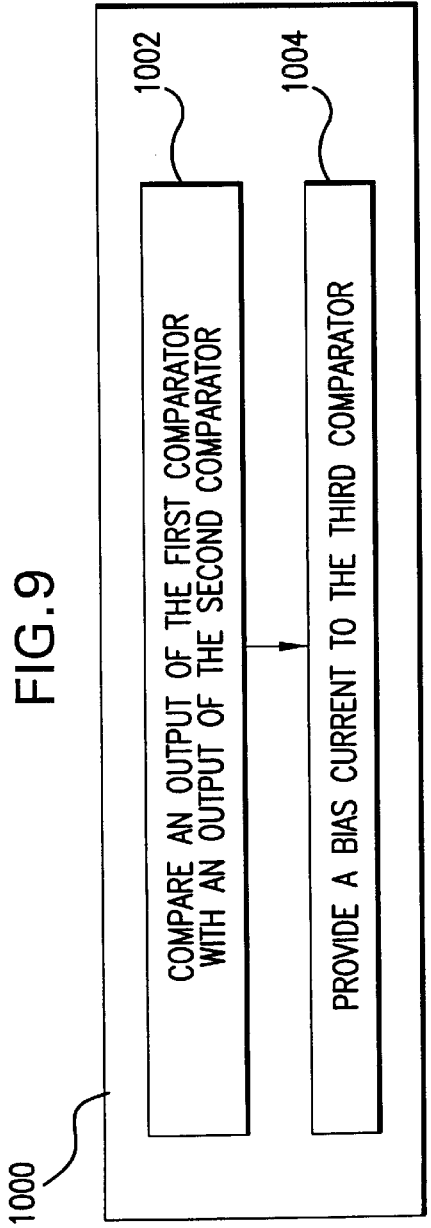

HIGH SPEED, LOW POWER COMPARATOR

BACKGROUND OF THE INVENTION

1. Field of the Invention

The present invention relates to high speed, low power comparators.

2. Background Art

Commercialization of the Internet has proven to be a mainspring for incentives to improve network technologies. Development programs have pursued various approaches including strategies to leverage use of the existing Public Switched Telephone Network and plans to expand use of wireless technologies for networking applications. Both of these approaches (and others) entail the conversion of data between analog and digital formats. Therefore, it is expected that analog-to-digital converters (ADCs) and digital-to-analog converters (DACs) will continue to perform critical functions in many network applications.

Because ADCs find uses in a wide variety of applications, design of these circuits has evolved along many paths to yield several distinct architectures, including "delta sigma," "successive approximation," "pipelined," "subranging," "folding," and "flash." Comparators are the basic building block in each of these designs, and some architectures—such as pipelined, subranging, folding, and flash—use an array of comparators.

For example, FIG. 1 is a block diagram of an exemplary conventional two-bit flash ADC 100. ADC 100 comprises a first comparator "A" 102, a second comparator "B" 104, a third comparator "C" 106, a priority encoder 108, a first resistor "$R_1$" 110, a second resistor "$R_2$" 112, a third resistor "$R_3$" 114, and a fourth resistor "$R_4$" 116. Each of $R_1$ 110, $R_2$ 112, $R_3$ 114, and $R_4$ 116 has the same measure of resistance. $R_1$ 110, $R_2$ 112, $R_3$ 114, and $R_4$ 116 are connected in series between an analog ground "$V_{AG}$" 118 and a first supply voltage "$V_{DD}$" 120. (Alternatively, analog ground $V_{AG}$ 118 can be replaced by a second supply voltage "$V_{SS}$".) $R_1$ 110 is connected between $V_{AG}$ 118 and a first node "$N_1$," 122. $R_2$ 112 is connected between $N_1$ 122 and a second node "$N_2$" 124. $R_3$ 114 is connected between $N_2$ 124 and a third node "$N_3$" 126. $R_4$ 116 is connected between $N_3$ 126 and $V_{DD}$ 120. In this configuration, the voltage at $N_1$ 122 (the reference voltage of comparator A 102) is equal to $V_{DD}/4$, the voltage at $N_2$ 124 (the reference voltage of comparator B 104) is equal to $V_{DD}/2$, and the voltage at $N_3$ 126 (the reference voltage of comparator C 106) is equal to $3V_{DD}/4$.

The inverting terminals of comparators A 102, B 104, and C 106 are connected to, respectively, $N_1$, 122, $N_2$ 124, and $N_3$ 126. An analog signal "x" 128 is received at an input 130, which is connected to the noninverting terminals of comparators A 102, B 104, and C 106. A quantized signal is produced at the output terminal of each comparator. Quantized signals "$w_1$" 132, "$w_2$" 134, and "$w_3$" 136 are produced at the output terminals of, respectively, comparators A 102, B 104, and C 106. Each quantized signal has a voltage with a value "LOW" or a value "HIGH" depending upon whether a corresponding value of the voltage of analog signal x 128 is less than (or equal to) or greater than the voltage at the inverting terminal of the corresponding comparator (i.e., the reference voltage of the comparator). For example, when the value of the voltage of analog signal x 128 is less than or equal to $V_{DD}/4$, the values of the voltages of $w_3$ 136, $w_2$ 134, and $w_1$ 132 are equal to, respectively, LOW, LOW, and LOW. When the value of the voltage of analog signal x 128 is less than or equal to $V_{DD}/2$, but greater than $V_{DD}/4$, the values of the voltages of $w_3$ 136, $w_2$ 134, and $w_1$ 132 are equal to, respectively, LOW, LOW, and HIGH. When the value of the voltage of analog signal x 128 is less than or equal to $3V_{DD}/4$, but greater than $V_{DD}/2$, the values of the voltages of $w_3$ 136, $w_2$ 134, and $w_1$ 132 are equal to, respectively, LOW, HIGH, and HIGH. When the value of the voltage of analog signal x 128 is less than or equal to $V_{DD}$, but greater than $3V_{DD}/4$, the values of the voltages of $w_3$ 136, $w_2$ 134, and $w_1$ 132 are equal to, respectively, HIGH, HIGH, and HIGH.

The output terminals of comparators A 102, B 104, and C 106 are connected to priority encoder 108. Quantized signals $w_1$ 132, $w_2$ 134, and $w_3$ 136 are received by priority encoder 108, which processes them to produce, at an output 138, a two-bit digital signal "y" comprising a least significant bit (LSB) signal "$y_1$," 140 and a most significant bit (MSB) signal "$y_2$," 142.

The skilled artisan will appreciate that, with additional comparators and resistors and by using a priority encoder capable of processing additional quantized signals, flash ADC 100 can be modified so that digital signal y comprises more than two bit signals. Alternatively, flash ADC 100 can be modified so that digital signal y comprises one bit signal.

Implementations of comparators A 102, B 104, and C 106 often use current-mode latch circuits. FIG. 2 is a schematic diagram of an exemplary conventional current-mode latch circuit 200 that can be used in an implementation of any of comparators A 102, B 104, or C 106. Latch circuit 200 comprises a cross-connected pair of transistors 202 connected between a reset switch 204 and first supply voltage $V_{AG}$ 118. Preferably, cross-connected pair 202 comprises a first NMOSFET (n-channel Metal Oxide Semiconductor Field Effect Transistor) "$M_1$," 206 and a second NMOSFET "$M_2$." 208. Ideally, $M_1$ 1 206 and $M_2$ 208 are matched transistors. Preferably, each of $M_1$ 206 and $M_2$ 208 has a gain greater than one. However, cross-connected pair 202 can function if the product of the individual gains of $M_1$ 206 and $M_2$ 208 (i.e., the loop gain) is greater than one. The gate terminal of $M_2$ 208 is connected to the drain terminal of $M_1$ 206 at a first port "$N_4$" 210. The gate terminal of $M_1$ 206 is connected to the drain terminal of $M_2$ 208 at a second port "$N_5$" 212. The source terminals of $M_1$ 206 and $M_2$ 208 are together connected to analog ground $V_{AG}$ 118. Preferably, reset switch 204 comprises a third NMOSFET "$M_3$" 214. The source terminal of $M_3$ 214 is connected to the drain terminal of one of $M_1$ 206 or $M_2$ 208; the drain terminal of $M_3$ 214 is connected the drain terminal of the other of $M_1$ 206 or $M_2$ 208. A clock waveform "Ck" 216 is applied to the gate terminal of $M_3$ 214. Ck 216 cycles between an "UP" voltage and an "DOWN" voltage at a sampling frequency.

The skilled artisan will appreciate that $M_1$ 206, $M_2$ 208, and $M_3$ 214 can also be realized in other field effect, junction, or combination transistor technologies. In general, reset switch 204 can be realized in a variety of switch technologies, including microelectromechanical embodiments. Latch circuit 200 can also be used for other applications.

For each latch circuit 200 in ADC 100, quantized signal "w" (e.g., $w_1$ 132, $w_2$ 134, or $w_3$ 136) is produced as an output voltage at $N_4$ 210 or $N_5$ 212. Latch circuit 200 is often preceded by an input stage (not shown) that includes a differential amplifier so that the voltage of analog signal x 128, applied at the noninverting terminal of the comparator, can be compared with the voltage at the inverting terminal of the comparator. For example, the voltage of analog signal x 128 is compared with $V_{DD}/4$, for comparator A 102; $V_{DD}/2$, for comparator B 104; and $3V_{DD}/4$, for comparator C 106.

For each latch circuit 200 in ADC 100, the input stage produces a differential current signal comprising a first current signal "$i_1$" 218 and a second current signal "$i_2$" 220. First and second current signals $i_1$ 218 and $i_2$ 220 each comprise a bias current "$i_b$" and a signal current "$i_s$". The relationship between bias current $i_b$ and signal current $i_s$ in first current signal $i_1$ 218 can be expressed as shown in Eq. (1):

$$i_1 = i_b + (1/2)(i_s), \qquad \text{Eq. (1)}$$

while the relationship between bias current $i_b$ and signal current $i_s$ in second current signal $i_2$ 220 can be expressed as shown in Eq. (2):

$$i_2 = i_b - (1/2)(i_s). \qquad \text{Eq. (2)}$$

The differential amplifier is configured so that first current signal $i_1$ 218 increases and decreases in response to, respectively, the rise and drop of the voltage of analog signal x 128, while second current signal $i_2$ 220 increases and decreases in response to, respectively, the drop and rise of the voltage of analog signal x 128. Thus, first and second current signals $i_1$ 218 and $i_2$ 220 always change currents in opposite directions, but the sum of first and second current signals $i_1$ 218 and $i_2$ 220 remains equal to twice the bias current $i_b$.

For each latch circuit 200 in ADC 100, the differential amplifier is configured so that no signal current $i_s$ is produced when the voltage of analog signal x 128, applied at the noninverting terminal of the comparator, equals the voltage at the inverting terminal of the comparator. For example, for comparator A 102, no signal current $i_s$ is produced when the voltage of analog signal x 128 equals $V_{DD}/4$; for comparator B 104, no signal current $i_s$ is produced when the voltage of analog signal x 128 equals $V_{DD}/2$; and for comparator C 106, no signal current $i_s$ is produced when the voltage of analog signal x 128 equals $3V_{DD}/4$.

In latch circuit 200, first current signal $i_1$ 218 and second current signal $i_2$ 220 are received as input current signals at, respectively, $N_4$ 210 and $N_5$ 212. When the voltage of Ck 216 is UP (i.e, the reset phase), $M_3$ 214 connects $N_4$ 210 with $N_5$ 212, so that the steady state voltages at both nodes are equal, and bias current $i_b$ flows through each of $M_1$ 206 and $M_2$ 208. Parasitic capacitances at each of nodes $N_4$ 210 and $N_5$ 212 are charged by bias current $i_b$ that flows through each of $M_1$ 206 and $M_2$ 208. The skilled artisan will appreciate that the parasitic capacitance at, for example, $N_4$ 210, includes the gate-to-source capacitance of $M_2$ 208, the drain-to-substrate capacitance of $M_1$ 206, the drain-to-substrate capacitance of $M_3$ 214, and the capacitance of the wiring connecting circuit devices. Bias current $i_b$ charges the parasitic capacitances at each of nodes $N_4$ 210 and $N_5$ 212 so that the voltages at $N_4$ 210 and $N_5$ 212 are at a metastable "MID" value that is between LOW and HIGH. The gate and drain terminals of $M_1$ 206 and $M_2$ 208 are connected together. $M_1$ 206 and $M_2$ 208 are sized so that, under these conditions, they operate in "ON" states.

When the voltage of Ck 216 is DOWN (i.e., the sampling phase), the states of $M_1$ 206 and $M_2$ 208 are controlled by first and second current signals $i_1$ 218 and $i_2$ 220. For example, when first current signal $i_1$ 218 is greater than bias current $i_b$ and second current signal $i_2$ 220 is less than bias current $i_b$, a transient is initiated to force $M_1$ 206 to operate in an "OFF" state, while $M_2$ 208 remains operating in an ON state. The course of this transient depends on how first and second current signals $i_1$ 218 and $i_2$ 220 change during the sampling phase. If $M_1$ 206 is turned OFF and the parasitic capacitances at $N_4$ 210 are fully charged by first current signal $i_1$ 218 (i.e., at a new steady state), the voltage at $N_4$ 210 is HIGH and the voltage at $N_5$ 212 is LOW.

It is a characteristic of latch circuit 200 that the port (i.e., $N_4$ 210 or $N_5$ 212) receiving the current signal (i.e., $i_1$ 218 or $i_2$ 220) that is greater than bias current $i_b$ requires more time to reach its new steady state voltage than the port receiving the current signal that is less than bias current $i_b$. However, if first and second current signals $i_1$ 218 and $i_2$ 220 both have values near to that of bias current $i_b$ (i.e., small signal current $i_s$), it is possible that the output voltage (at $N_4$ 210 or $N_5$ 212) may not reach LOW or HIGH before the end of the sampling phase, but remain in a metastable condition. Such a situation is more likely to occur if Ck 216 cycles at a high sampling frequency. In this situation, the quantized signal (i.e., $w_1$ 132, $w_2$ 134, or $w_3$ 136) produced by the comparator associated with latch circuit 200 (i.e., comparator A 102, B 104, or C 106) does not get registered as a digital input to priority encoder 108. Consequently, ADC 100 does not produce a digital signal y. Such a "non-decision" is referred to as a "bit error". Bit errors can adversely effect the performance of a system that uses the digital output of ADC 100.

Bit errors can be reduced by increasing bias current $i_b$ so that only a small signal current $i_s$ is needed to force the port (i.e., $N_4$ 210 or $N_5$ 212) receiving the current signal (i.e., $i_1$ 218 or $i_2$ 220) that is greater than bias current $i_b$ to reach its new steady state voltage. This increases the overall speed of latch circuit 200. However, increasing bias current $i_b$ can decrease the signal-to-noise ratio of ADC 100. Moreover, increasing bias current $i_b$ in all of the comparators of ADC 100 causes ADC 100 to dissipate more power, particularly because each comparator draws twice the bias current $i_b$ during both the sampling and the reset phases. Such a situation is undesirable where ADC 100 is employed in a system that demands low power consumption, such as a portable wireless application. What is needed is a technique to identify which comparator, in the array of comparators, is in a metastable condition, and to increase the rate at which the identified comparator transitions to a steady state.

BRIEF SUMMARY OF THE INVENTION

The present invention relates to high speed, low power comparators. In an array of comparators, the present invention provides a technique to identify which comparator is in a metastable condition, and to increase the rate at which the identified comparator transitions to a steady state. A bias current is provided to the identified comparator in the metastable condition, such that the rate at which the comparator in the metastable condition transitions to the steady state is increased.

In an embodiment, the bias current is provided by controlling a current output from a variable current source that provides the bias current for a latch circuit of the identified comparator in the metastable condition.

In another embodiment, the comparator in the metastable condition is identified by comparing a characteristic of a first comparator of the array of comparators with a characteristic of a second comparator of the array of comparators. The first comparator and the second comparator are separated in the array of comparators by a third comparator in the array of comparators. It is determined if the third comparator is the comparator in the metastable condition based on the compared characteristics. Preferably, the characteristics are compared by receiving the first and second characteristics as inputs to an Exclusive OR gate.

In yet another embodiment, the bias current is provided by controlling a current output from a variable current source that provides the bias current for a latch circuit of the identified comparator in the metastable condition with an output of an Exclusive OR gate.

In still another embodiment, the bias current is provided by connecting a first current source in parallel with a second current source to increase the bias current for a latch circuit of the identified comparator in the metastable condition. Preferably, a switch that connects the first current source in parallel with the second current source is controlled by an output of an Exclusive OR gate.

The present invention also provides a method to increase, in an array of comparators that includes a first, a second, and a third comparator, a rate at which the third comparator transitions to a steady state. An output of the first comparator is compared with an output of the second comparator, and a bias current is provided to the third comparator based on the compared first and second outputs.

In an embodiment, the outputs are compared by receiving the first and second outputs as inputs to an Exclusive OR gate. Preferably, a variable current source that provides the bias current for a latch circuit of the third comparator is controlled based on an output of an Exclusive OR gate.

In another embodiment, the bias current is provided to the third comparator by connecting a first current source in parallel with a second current source to increase the bias current for a latch circuit of the third comparator. Preferably, a switch that connects the first current source in parallel with the second current source is controlled based on an output of an Exclusive OR gate.

The present invention also comprises an array of comparators comprising a first, a second, and a third comparator, an Exclusive OR gate having a first input connected to an output of the first comparator and a second input connected to an output of the second comparator, and a variable current source connected to an output of the Exclusive OR gate. The variable current source supplies a bias current to the third comparator. Preferably, the output of the Exclusive OR gate produces a signal that controls the variable current source. Preferably, the third comparator is arranged in the array of comparators between the first comparator and the second comparator.

In an embodiment, the third comparararator comprises a latch circuit configured to receive the bias current. Preferably, the latch circuit comprises a cross connected pair of transistors connected between a reset switch and a supply voltage. The latch circuit has a first port capable of receiving a first current signal and producing a first output voltage, and a second port capable of receiving a second current signal and producing a second output voltage. In an embodiment, the cross connected pair of transistors comprises a first MOSFET and a second MOSFET configured so that the gate terminal of the first MOSFET is connected to the drain terminal of the second MOSFET, the gate terminal of the second MOSFET is connected to the drain terminal of said the MOSFET, and the source terminals of the first and the second MOSFETs are connected to the supply voltage. Preferably, the reset switch comprises a MOSFET connected between the first port and the second port.

In another embodiment, the array of comparators further comprises a second Exclusive OR gate having an input connected to an output of the third comparator, and a second variable current source connected to an output of the second Exclusive OR gate. The second variable current source supplies a second bias current to the second comparator.

The present invention also comprises an analog to digital converter. The analog to digital comparator comprises an array of comparators, a priority encoder, an array of Exclusive OR gates, and an array of variable current sources. The array of comparators has respective inputs configured to receive an analog signal, and respective outputs configured to produce quantized signals responsive to the analog signal. The priority encoder is connected to the array of comparators, and is configured to produce a digital signal at an output responsive to the quantized signals. Each Exclusive OR gate of the array of Exclusive OR gates is configured to receive two of the quantized signals. Each variable current source of the array of variable current sources is configured to provide a bias current to a corresponding comparator of the array of comparators, and is controlled by an output of a corresponding Exclusive OR gate of the array of Exclusive OR gates.

In an embodiment, each Exclusive OR gate of the array of Exclusive OR gates produces a logic signal that controls a corresponding variable current source of the array of variable current sources. Preferably, each comparator of the array of comparators includes a latch circuit configured to receive a corresponding bias current. In another embodiment, the corresponding bias current is capable of being increased by a corresponding variable current source of the array of variable current sources.

Further embodiments, features, and advantages of the present invention, as well as the structure and operation of the various embodiments of the present invention, are described in detail below with reference to the accompanying figures.

BRIEF DESCRIPTION OF THE FIGURES

The accompanying drawings, which are incorporated herein and form part of the specification, illustrate the present invention and, together with the description, further serve to explain the principles of the invention and to enable a person skilled in the pertinent art to make and use the invention.

FIG. 1 is a block diagram of an exemplary conventional two-bit flash ADC 100.

FIG. 2 is a schematic diagram of an exemplary conventional current-mode latch circuit 200 that can be used in an implementation of any of comparators A 102, B 104, or C 106.

FIG. 9 shows a flow chart of a preferred method to identify the comparator in the metastable condition.

FIG. 10 shows a flow chart of a method 1000 for increasing, in an array of comparators that includes a first, a second, and a third comparator, a rate at which the third comparator transitions to a steady state.

The preferred embodiments of the invention are described with reference to the figures where like reference numbers indicate identical or functionally similar elements. Also in the figures, the left-most digit of each reference number identifies the figure in which the reference number is first used.

DETAILED DESCRIPTION OF THE INVENTION

The present invention relates to high speed, low power comparators. Where a functional component of a system—such as, but not limited to, a pipelined, subranging, folding, or flash ADC—uses an array of comparators, the present invention provides a technique to identify which comparator is in a metastable condition, and to increase the rate at which the identified comparator transitions to a steady state.

Figure 3:
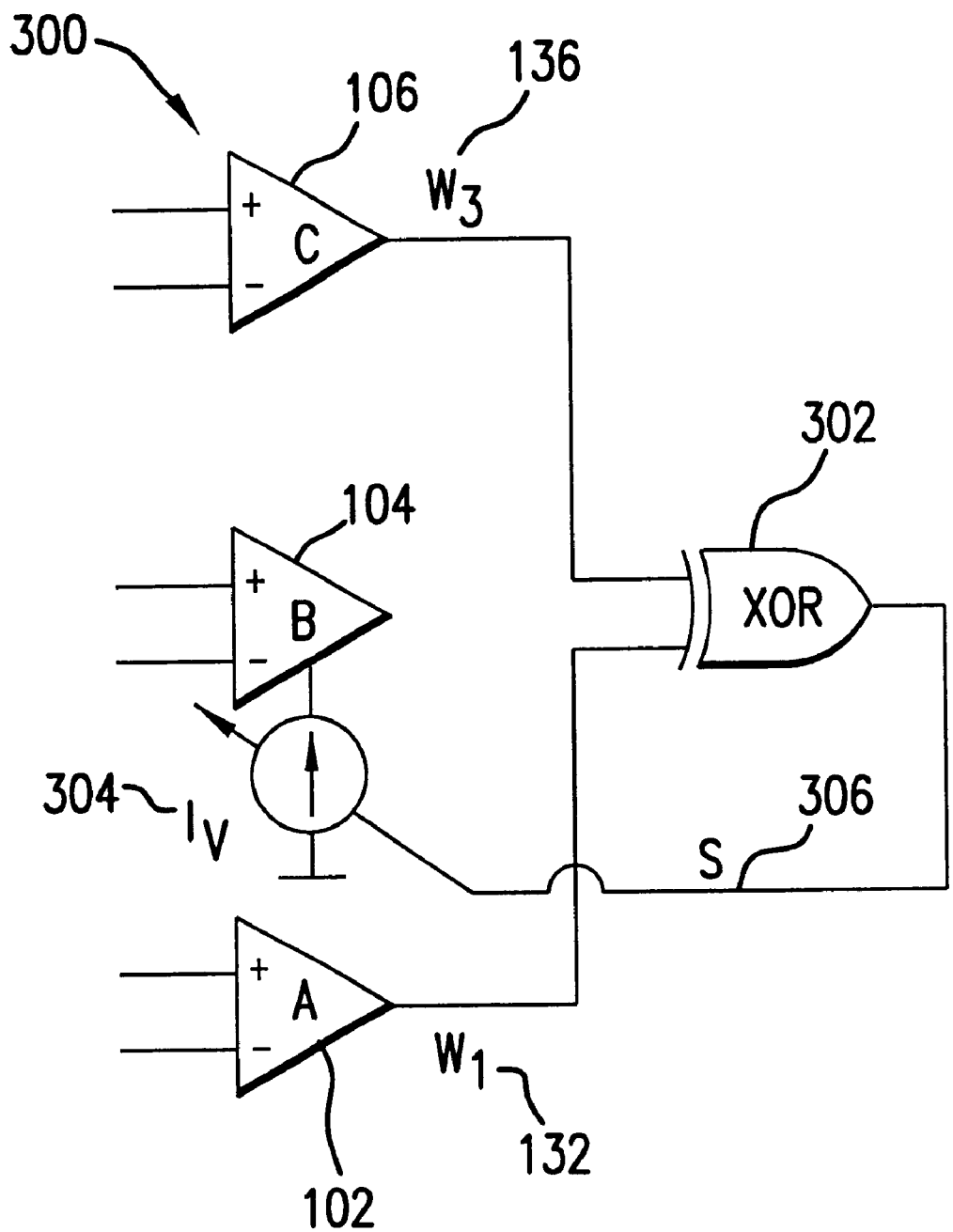
FIG. 3 is a block diagram of an array 300 of current-mode comparators configured in the manner of an embodiment of the present invention.

FIG. 3 is a block diagram of an array 300 of current-mode comparators configured in the manner of an embodiment of the present invention. Array 300 comprises comparator A 102, comparator B 104, comparator C 106, an Exclusive OR gate "XOR" 302, and a variable current source "$I_v$" 304. Quantized signals $w_1$ 132 and $w_3$ 136 are received as inputs to XOR 302. XOR 302 produces a logic signal "s" 306 that controls variable current source $I_v$ 304. Variable current source $I_v$ 304 augments bias current $i_b$ for the latch circuit associated with second comparator B 104 in response to the value of logic signal s 306.

The skilled artisan will appreciate that logic signal s 306 equals one only if quantized signals $w_1$ 132 and $w_3$ 136 have different values. If quantized signals $w_1$ 132 and $w_3$ 136 have the same values, then logic signal s 306 equals zero. For example, when the values of the voltages of $w_1$ 132 and $w_3$ 136 are equal to, respectively, LOW and LOW, then logic signal s 306 is zero. When the values of the voltages of $w_1$ 132 and $w_3$ 136 are equal to, respectively, LOW and HIGH, then logic signal s 306 is one. When the values of the voltages of $w_1$ 132 and $w_3$ 136 are equal to, respectively, HIGH and LOW, then logic signal s 306 is one. When the values of the voltages of $w_1$ 132 and $w_3$ 136 are equal to, respectively, HIGH and HIGH, then logic signal s 306 is zero. The skilled artisan will also appreciate that such a comparison of quantized signals $w_1$ 132 and $w_3$ 136 can be realized by applying them to other types of logic gates that are configured in a manner to produce the same result as XOR 302.

The present invention is based on the likelihood that, for example, comparator B 104 will be in a metastable condition when comparator A 102 produces quantized signal $w_1$ 132 with value HIGH and comparator C 106 produces quantized signal $w_3$ 136 with value LOW. In this situation, logic signal s 306 is one and, in response, variable current source $I_v$ 304 augments bias current $i_b$ for the latch circuit associated with comparator B 104. Increasing bias current $i_b$ increases both first and second current signals $i_1$ 218 and $i_2$ 220 and decreases the time needed for the port (i.e., $N_4$ 210 or $N_5$ 212) receiving the current signal (i.e., $i_1$, 218 or $i_2$ 220) that is greater than bias current $i_b$ to reach its new steady state voltage. This decreases the probability that comparator B 104 will remain in a metastable condition and thus reduces the bit error rate (BER).

For example, in ADC 100, if analog signal x 128 is nearly equal to $V_{DD}/2$. then a small signal current $i_s$ is produced for comparator B 104, a large positive signal current $i_s$ is produced for comparator A 102, and a large negative signal current $i_s$ is produced for comparator C 106. In this situation, comparator A 102 quickly produces quantized signal $w_1$ 132 with value HIGH, and comparator C 106 quickly produces quantized signal $w_3$ 136 with value LOW, but comparator B 104 may be slow to produce a digital value for quantized signal $w_2$ 134 before the end of the sampling phase. Increasing bias current $i_b$ to the latch circuit associated with comparator B 104 increases its overall speed, decreases the likelihood that it will remain in a metastable state, and reduces the BER.

Figure 4A:
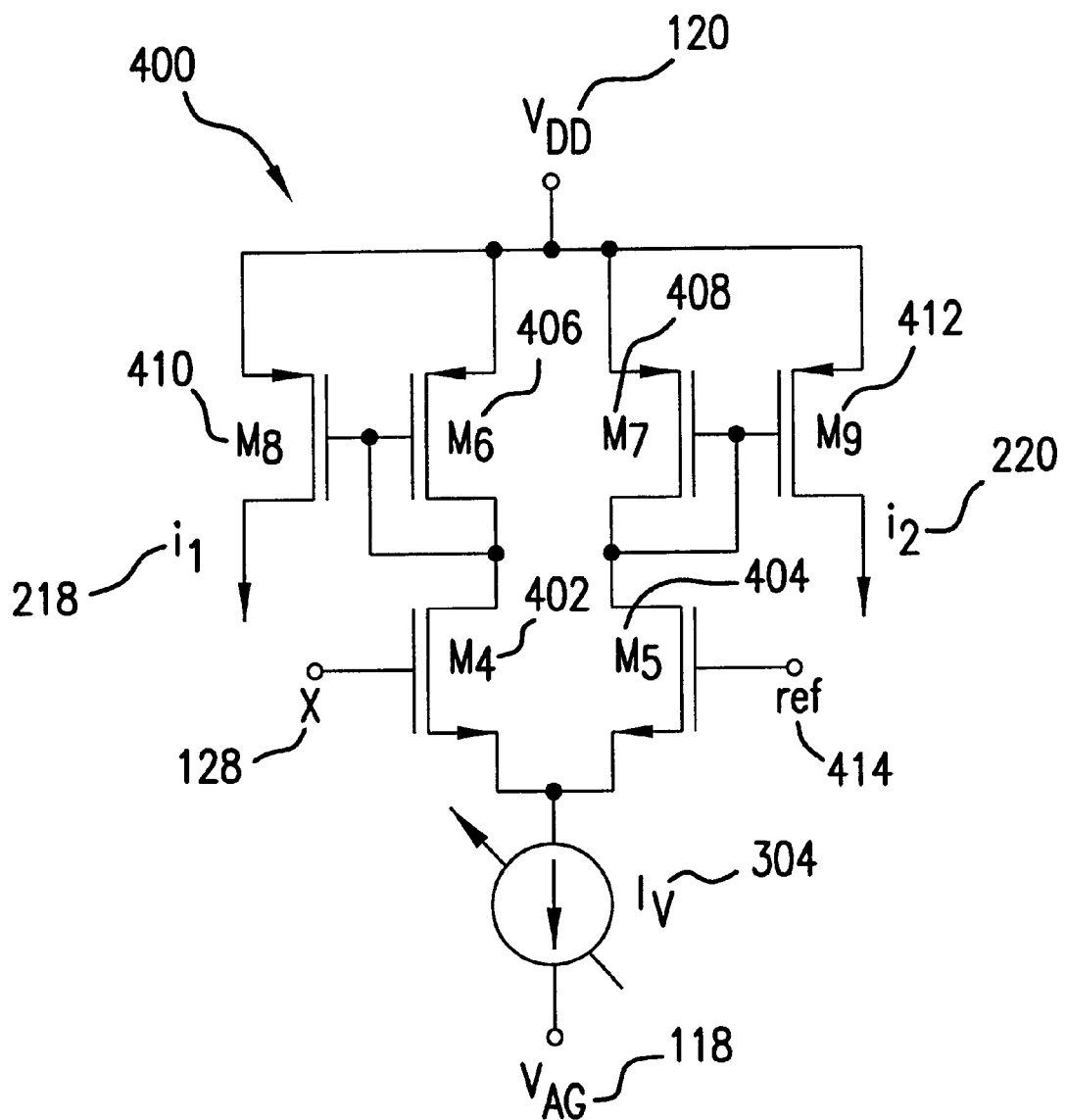
FIG. 4A is a schematic diagram of an input stage 400 that can be used with latch circuit 200 in an implementation of any of comparators A 102, B 104, or C 106.

FIG. 4A is a schematic diagram of an input stage 400 that can be used with latch circuit 200 in an implementation of any of comparators A 102, B 104, or C 106. Input stage 400 receives analog signal x 128 and produces first and second current signals $i_1$ 218 and $i_2$ 220, which are received by latch circuit 200. Input stage 400 comprises amplifying MOSFETs "$M_4$" 402 and "$M_5$" 404, load MOSFETs "$M_6$" 406 and "$M_7$" 408, current mirror MOSFETs "$M_8$" 410 and "$M_9$" 412, and variable current source $I_v$ 304.

Amplifying MOSFETs $M_4$ 402 and $M_5$ 404 are configured as a differential pair with their source terminals connected together. A load MOSFET is connected to the drain terminal of each amplifying MOSFET. The drain terminal of $M_6$ 406 is connected to the drain terminal of $M_4$ 402; the drain terminal of $M_7$ 408 is connected to the drain terminal of $M_5$ 404. The source terminals of $M_6$ 406 and $M_7$ 408 are together connected to first supply voltage $V_{DD}$ 120. The source terminals of current mirror MOSFETs $M_8$ 410 and $M_9$ 412 are also together connected to first supply voltage $V_{DD}$ 120. The gate terminal of $M_8$ 410 is connected to the gate and drain terminals of $M_6$ 406; the gate terminal of $M_9$ 412 is connected to the gate and drain terminals of $M_7$ 408. Variable current source $I_v$ 304 is connected between the source terminal of $M_4$ 402 and $M_5$ 404 and analog ground $V_{AG}$ 118. In input stage 400, $M_4$ 402 and $M_5$ 404 are NMOSFETs, while $M_6$ 406, $M_7$ 408, $M_8$ 410, and $M_9$ 412 are PMOSFETs (p-channel MOSFETs). However, this configuration can be reversed depending upon the overall configuration of the comparator associated with latch circuit 200. Furthermore, the skilled artisan will appreciate that $M_4$ 402, $M_5$ 404, $M_6$ 406, $M_7$ 408, $M_8$ 410, and $M_9$ 412 can also be realized in other field effect, junction, or combination transistor technologies.

The voltage of analog signal x 128 is received by input stage 400 at the noninverting terminal of the comparator (e.g., A 102, B 104, or C 106). This allows the voltage of analog signal x 128 to be compared with a reference voltage "ref" 414 received at the inverting terminal of the comparator. For example, the voltage of analog signal x 128 is compared with $V_{DD}/4$, for comparator A 102; $V_{DD}/2$, for comparator B 104; and 3 $V_{DD}/4$, for comparator C 106. The noninverting terminal of the comparator is connected to the gate terminal of $M_4$ 402. The inverting terminal of the comparator is connected to the gate terminal of $M_5$ 404.

Amplifying MOSFETs $M_4$ 402 and $M_5$ 404 act to control the distribution of current provided by variable current source $I_v$ 304. The sum of the current flowing through both $M_4$ 402 and $M_5$ 404 equals the current provided by variable current source $I_v$ 304, which is equal to twice bias current $i_b$. For example, as the voltage received at the gate terminal of $M_4$ 402 rises with respect to the voltage received at the gate terminal of $M_5$ 404, the portion of the total current that flows through $M_4$ 402 and $M_6$ 406 increases, while the portion of the total current that flows through $M_4$ 404 and $M_7$ 408 decreases. $M_8$ 410 mirrors the increase in current flowing through M$_6$ 406 to produce first current signal i$_1$ 218 at the drain terminal of M$_8$ 410. M$_9$ 412 mirrors the decrease in current flowing through M$_7$ 408 to produce second current signal i$_2$ 220 at the drain terminal of M$_9$ 412.

Variable current source I$_v$ 304 is controlled by Exclusive OR gate XOR 302. When logic signal s 306 produced by Exclusive OR gate XOR 302 is one, the current produced by variable current source I$_v$ 304 is increased, which increases bias current i$_b$ for latch circuit 200. Increasing bias current i$_b$ increases both first and second current signals i$_1$ 218 and i$_2$ 220 and decreases the time needed for the port (i.e., N$_4$ 210 or N$_5$ 212) receiving the current signal (i.e., i$_1$ 218 or i$_2$ 220) that is greater than bias current i$_b$ to reach its new steady state voltage. This increases the overall speed of latch circuit 200 and decreases the likelihood that it will remain in a metastable state.

Figure 4B:
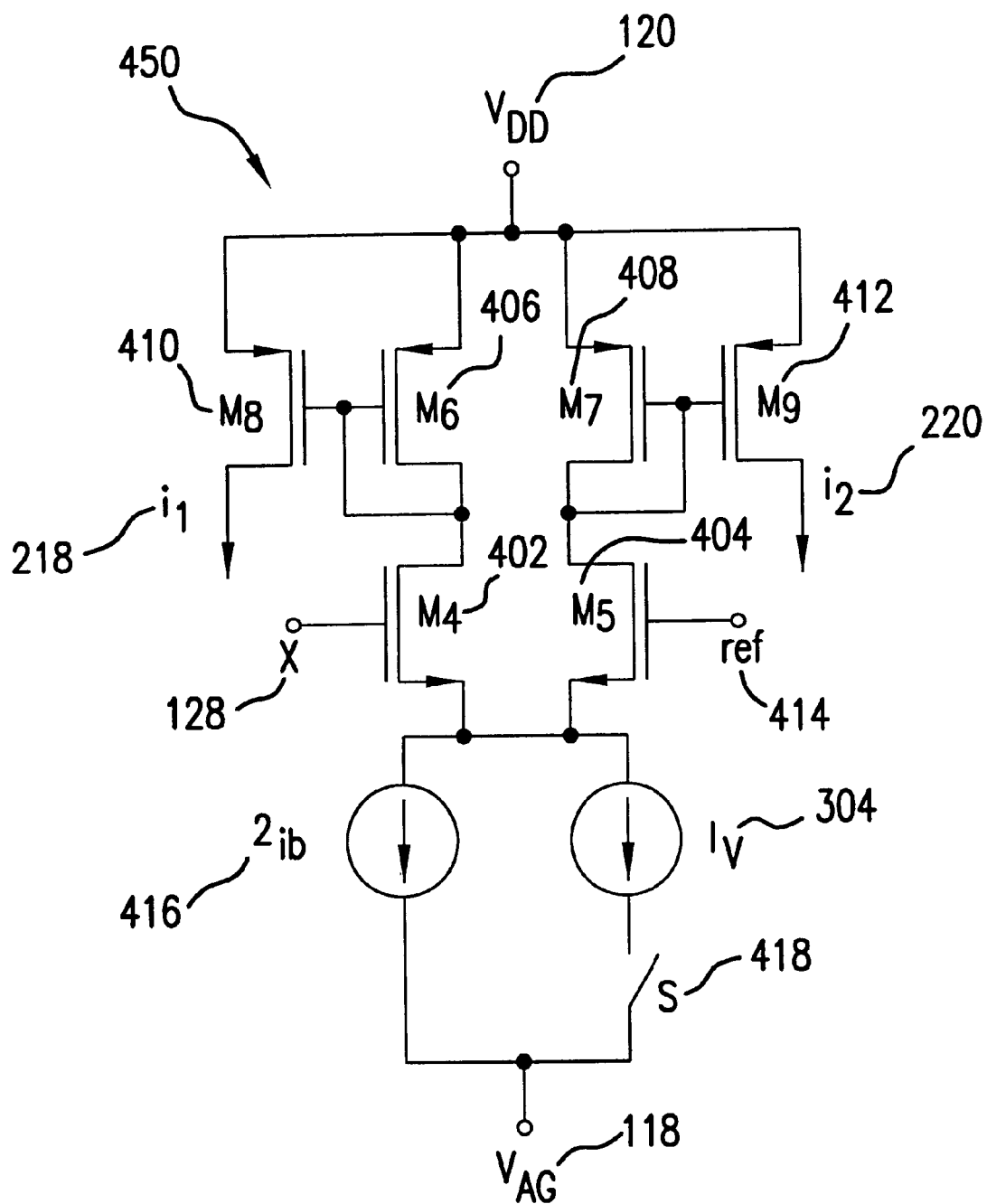
FIG. 4B is a schematic diagram of an input stage 450 that can be used with latch circuit 200 in an implementation of any of comparators A 102, B 104, or C 106.

FIG. 4B is a schematic diagram of an input stage 450 that can be used with latch circuit 200 in an implementation of any of comparators A 102, B 104, or C 106. Input stage 450 is configured in the same manner as input stage 400 except that: (1) a fixed current source "2i$_b$" 416 is connected in parallel with variable current source I$_v$ 304 between the source terminal of M$_4$ 402 and M$_5$ 404 and analog ground V$_{AG}$ 118, and (2) a switch "S" 418 is connected in series with variable current source I$_v$ 304 between the source terminal of M$_4$ 402 and M$_5$ 404 and analog ground V$_{AG}$ 118.

Fixed current source 2i$_b$ 416 produces a current that is equal to twice bias current i$_b$. Switch S 418 is controlled by Exclusive OR gate XOR 302. When logic signal s 306 produced by Exclusive OR gate XOR 302 is zero, switch S 418 is opened; when logic signal s 306 produced by Exclusive OR gate 302 is one, switch S 418 is closed. When switch S 418 is closed, the sum of the current flowing through both M$_4$ 402 and M$_5$ 404 equals the current provided by the sum of fixed current source 2i$_b$ 416 and variable current source I304. This sum current increases both first and second current signals i$_1$ 218 and i$_2$ 220 and decreases the time needed for the port (i.e., N$_4$ 210 or N$_5$ 212) receiving the current signal (i.e., i$_1$ 218 or i$_2$ 220) that is greater than bias current i$_b$ to reach its new steady state voltage. This increases the overall speed of latch circuit 200 and decreases the likelihood that it will remain in a metastable state.

As input stages 400 and 450 demonstrate, the skilled artisan could conceive of any number of circuits that could increase bias current i$_b$ based on the teachings given herein. Therefore, the present invention is not limited to the teachings of input stages 400 and 450.

Figure 5:
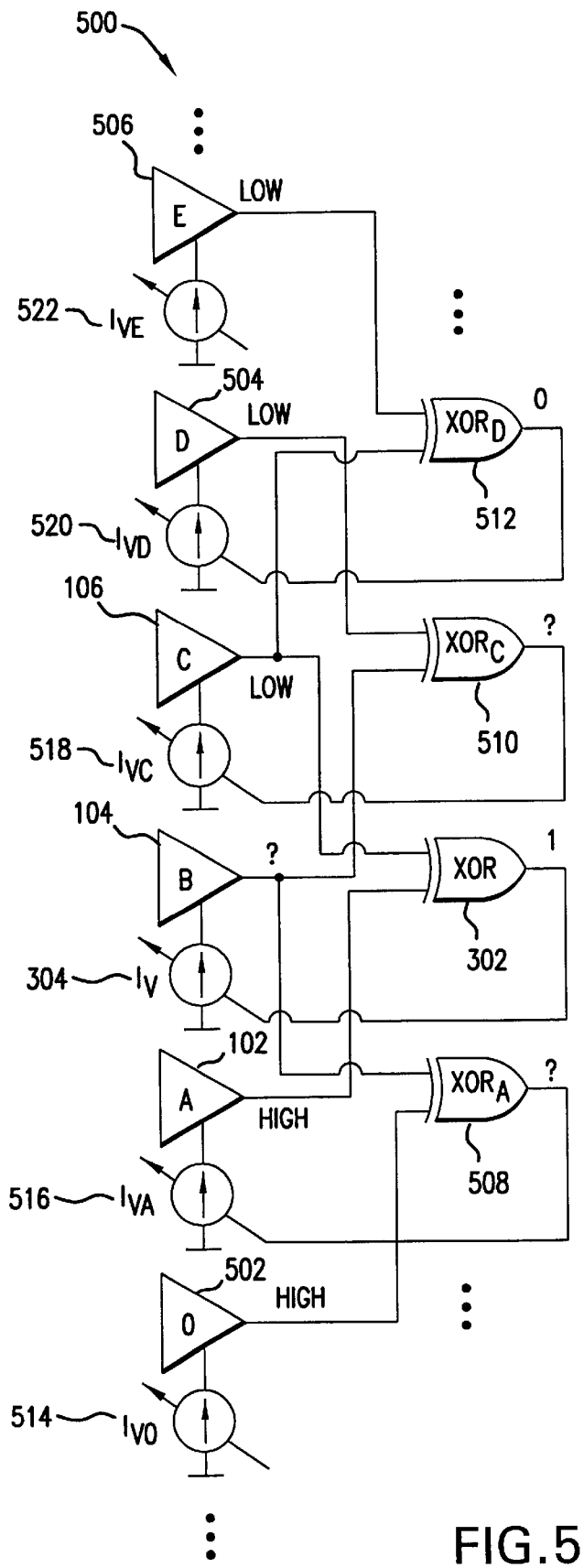
FIG. 5 is a block diagram of a portion of an array 500 of current-mode comparators configured in the manner of another embodiment of the present invention.

FIG. 5 is a block diagram of a portion of an array 500 of current-mode comparators configured in the manner of another embodiment of the present invention. The portion of array 500 comprises a comparator "O" 502, comparator A 102, comparator B 104, comparator C 106, a comparator "D" 504, a comparator "E" 506, an Exclusive OR gate "XOR$_A$" 508, Exclusive OR gate XOR 302, an Exclusive OR gate "XOR$_C$" 510, an Exclusive OR gate "XOR$_D$" 512, a variable current source "I$_{vO}$" 514, a variable current source "I$_{vA}$" 516, variable current source I$_v$ 304, a variable current source "I$_{vC}$" 518, a variable current source "I$_{vD}$" 520, and a variable current source "$I_{ve}$" 522.

As with array 300, the comparators, Exclusive OR gates, and variable current sources of portion of array 500 are configured such that an Exclusive OR gate produces a logic signal that controls a variable current source that augments bias current for a latch circuit of a comparator of the array. The Exclusive OR gate receives as inputs quantized signals from other comparators of the array that are adjacent on either side of the bias current augmented comparator. Thus, the portion of array 500 expands upon the teachings of array 300 to show how the present invention operates in an environment of multiple Exclusive OR gates.

For example, if analog signal x 128 is nearly equal to the reference voltage of comparator B 104, then comparators O 502 and A 102 will quickly produce quantized signals with values HIGH, and comparators C 106, D 504, and E 506 will quickly produce quantized signals with values LOW, but comparator B 104 may be slow to produce a digital value for its quantized signal before the end of the sampling phase.

In this situation, XOR$_A$ 508, which receives inputs from comparators O 502 and B 104, does not produce a digital output; XOR 302, which receives inputs from comparators A 102 and C 106, produces a digital output of one; XOR$_C$ 510, which receives its input from comparators B 104 and D 504, does not produce a digital output; and XOR$_D$ 512, which receives inputs from comparators C 106 and E 506, produces a digital output of zero. Thus, XOR 302 acts to cause variable current source 1$_v$ 304 to augment bias current i$_b$ for the latch circuit associated with comparator B 104.

If, in response to an increase in bias current i$_b$ for the latch circuit associated with comparator B 104, comparator B 104 transitions to a new steady state of, for example, HIGH, then XOR$_A$ 508 produces a digital output of zero, and XOR$_C$ 510 produces a digital output of one. Thus, XOR$_C$ 510 acts to cause variable current source I$_{VC}$ 518 to augment bias current i$_b$ for the latch circuit associated with comparator C 106.

The remaining Exclusive OR gates do not cause their respective variable current sources to augment the bias currents for the latch circuits associated with their comparators. Advantageously, this: (1) increases the speed of comparator B 104 and decreases the likelihood that it will remain in a metastable state, (2) reduces the BER of an ADC realized with array 500, and (3) limits the increase in current drawn (and hence power dissipated) by array 500 to realize the increased speed of comparator B 104.

Figure 6:
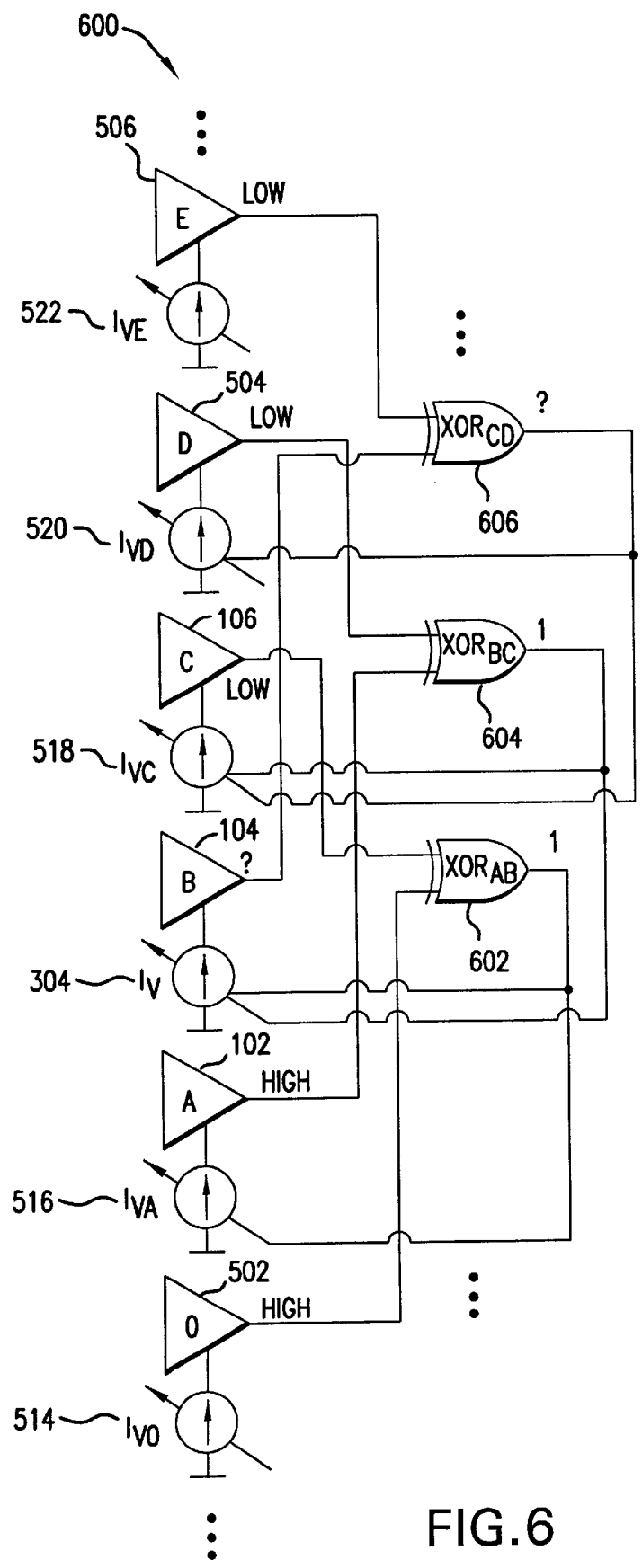
FIG. 6 is a block diagram of a portion of an array 600 of current-mode comparators configured in the manner of yet another embodiment of the present invention.

FIG. 6 is a block diagram of a portion of an array 600 of current-mode comparators configured in the manner of yet another embodiment of the present invention. The portion of array 600 comprises comparator O 502, comparator A 102, comparator B 104, comparator C 106, comparator D 504, comparator E 506, an Exclusive OR gate "XOR$_{AB}$" 602, an Exclusive OR gate "XOR$_{BC}$" 604, an Exclusive OR gate "XOR$_{CD}$" 606, variable current source I$_{vO}$ 514, variable current source I$_{vA}$ 516, variable current source I$_v$ 304, variable current source I$_{vC}$ 518, variable current source I$_{vD}$ 520, and variable current source $_{Ive}$ 522.

The portion of array 600 expands upon the teachings of array 500 to show how the present invention can provide the designer with a tradeoff between power dissipated and die area consumed. In the portion of array 600, XOR$_{AB}$ 602 receives inputs from comparators O 502 and C 106, and controls variable current sources I$_{vA}$ 516 and I$_v$ 304; XOR$_{BC}$ 604 receives inputs from comparators A 102 and D 504, and controls variable current sources I$_v$ 304 and I$_{vC}$ 518; and XOR$_{CD}$ 606 receives inputs from comparators B 104 and E 506, and controls variable current sources I$_{vC}$ 518 and I$_{vD}$ 520.

In this configuration, for example, if analog signal x 128 is nearly equal to the reference voltage of comparator B 104, then comparators O 502 and A 102 will quickly produce quantized signals with values HIGH, and comparators C 106, D 504, and E 506 will quickly produce quantized signals with values LOW, but comparator B 104 may be slow to produce a digital value for its quantized signal before the end of the sampling phase.

In this situation, XOR$_{AB}$ 602 produces a digital output of one, XOR$_{BC}$ 604 produces a digital output of one, and XOR$_{CD}$ 606 does not produce a digital output. Thus, XOR$_{AB}$ 602 and XOR$_{BC}$ 604 act to cause variable current sources I$_{VA}$ 516, I$_{V}$ 304, and I$_{VC}$ 518 to augment bias currents i$_b$ for the latch circuits associated with comparators A 102, B 104, and C 106.

If, in response to an increase in bias current i$_b$ for the latch circuit associated with comparator B 104, comparator B 104 transitions to a new steady state of, for example, HIGH, then XOR$_{CD}$ 606 produces a digital output of one. Thus, XOR$_{CD}$ 606 acts to cause variable current source I$_{VD}$ 520 to augments bias current i$_b$ for the latch circuit associated with comparator D 504.

The remaining Exclusive OR gates do not cause their respective variable current sources to augment the bias currents for the latch circuits associated with their comparators. Thus, for comparable realizations of arrays 500 and 600, array 600 draws more current (and hence. dissipates more power) than array 500. However, because array 600 uses fewer Exclusive OR gates, array 600 consumes less die area than array 500.

Figure 7:
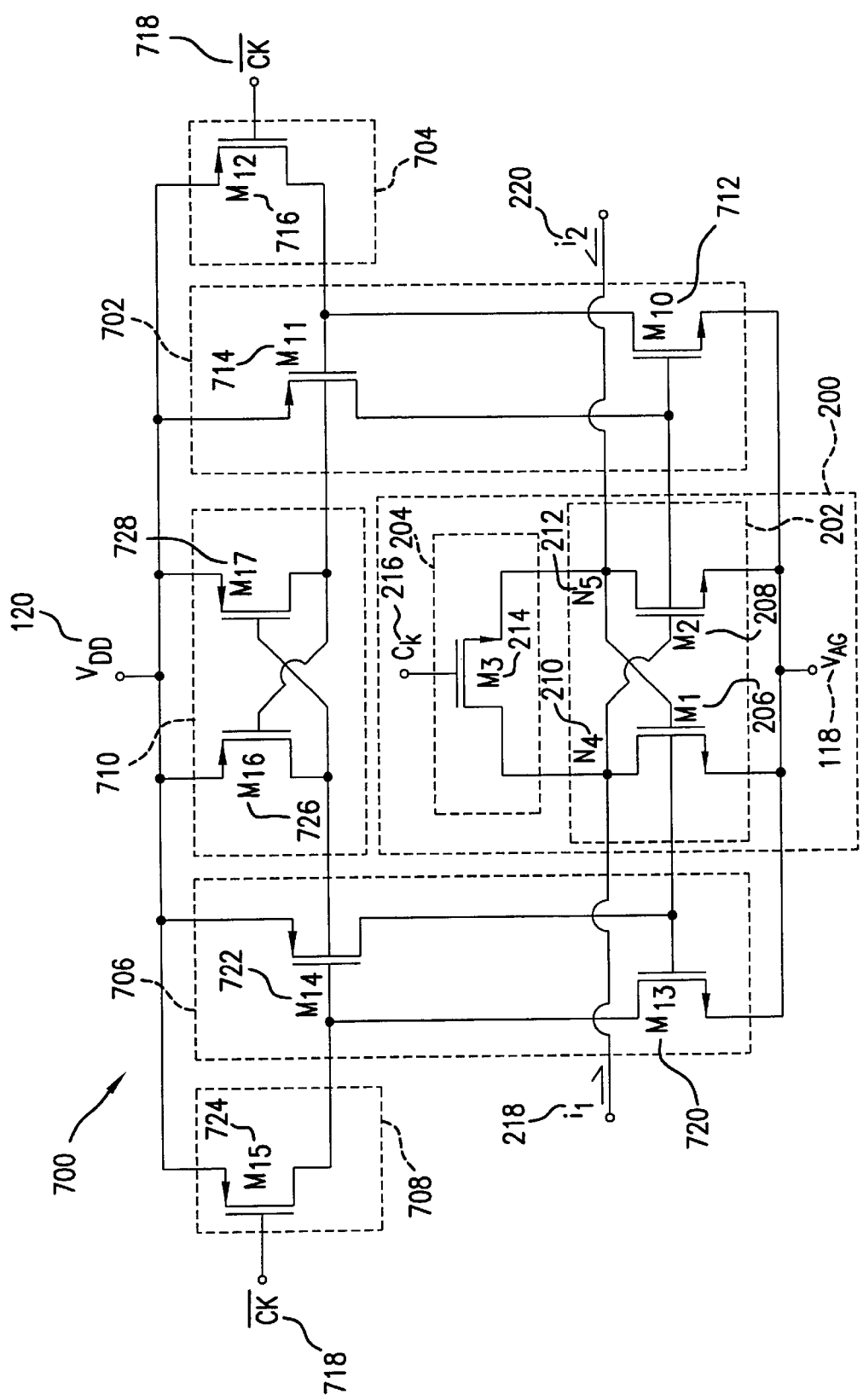
FIG. 7 is a schematic diagram of another current-mode latch circuit 700 that can be used in a realization of a comparator of the present invention.

FIG. 7 is a schematic diagram of another current-mode latch circuit 700 that can be used in a realization a comparator of the present invention. Latch circuit 700 comprises latch circuit 200, a first vertical latch 702 with a first vertical latch reset switch 704, a second vertical latch 706 with a second vertical latch reset switch 708, and a second pair of cross connected transistors 710.

First vertical latch 702 is connected between analog ground V$_{AG}$ 118 and first supply voltage V$_{DD}$ 120. Preferably, first vertical latch 702 comprises a fourth NMOSFET "M$_{10}$" 712 and a first PMOSFET "M$_{11}$" 714. Preferably, each of M$_{10}$ 712 and M$_{11}$ 714 has a gain greater than one. However, first vertical latch 702 can function if the product of the individual gains of M$_{10}$ 712 and M$_{11}$ 714 (i.e., the loop gain) is greater than one. The source terminal of M$_{10}$ 712 is connected to analog ground V$_{AG}$ 118. The drain terminal of M$_{10}$ 712 is connected to the gate terminal of M$_{11}$ 714. The gate terminal of M$_{10}$ 712 is connected to the gate terminal of M$_2$ 208. The source terminal of M$_{11}$ 714 is connected to first supply voltage V$_{DD}$ 120. The drain terminal of M$_{11}$ 714 is connected to the gate terminal of M$_{10}$ 712. The skilled artisan will appreciate that M$_{10}$ 712 and M$_{11}$ 714 can also be realized in other field effect, junction, or combination transistor technologies.

Preferably, first vertical latch reset switch 704 comprises a second PMOSFET "M$_{12}$" 716. The source terminal of M$_{12}$ 716 is connected to first supply voltage V$_{DD}$ 120. The drain terminal of M$_{12}$ 716 is connected to the gate terminal of M$_{11}$ 714. An inverse clock waveform "Ck.bar" 718 is applied to the gate terminal of M$_{12}$ 716. Ck.bar 718 cycles between DOWN voltage and UP voltage at the sampling frequency in a manner such that when the voltage of Ck 216 is UP, the voltage of Ck.bar 718 is DOWN, and vice versa. The skilled artisan will appreciate that M$_{12}$ 716 can also be realized in other field effect, junction, or combination transistor technologies. In general, first vertical latch reset switch 704 can be realized in a variety of switch technologies, including microelectromechanical embodiments.

Second vertical latch 706 is connected between analog ground V$_{AG}$ 118 and first supply voltage V$_{DD}$ 120. Preferably, second vertical latch 706 comprises a fifth NMOSFET "M$_{13}$" 720 and a third PMOSFET "M$_{14}$" 722. Preferably, each of M$_{13}$ 720 and M$_{14}$ 722 has a gain greater than one. However, second vertical latch 706 can function if the product of the individual gains of M$_{13}$ 720 and M$_{14}$ 722 (i.e., the loop gain) is greater than one. The source terminal of M$_{13}$ 720 is connected to analog ground V$_{AG}$ 118. The drain terminal of M$_{13}$ 720 is connected to the gate terminal of M$_{14}$ 722. The gate terminal of M$_{13}$ 720 is connected to the gate terminal of M$_1$ 206. The source terminal of M$_{14}$ 722 is connected to first supply voltage V$_{DD}$ 120. The drain terminal of M$_{14}$ 722 is connected to the gate terminal of M$_{13}$ 720. The skilled artisan will appreciate that M$_{13}$ 720 and M$_{14}$ 722 can also be realized in other field effect, junction, or combination transistor technologies.

Preferably, second vertical latch reset switch 708 comprises a fourth PMOSFET "M$_{15}$" 724. The source terminal of M$_{15}$ 724 is connected to first supply voltage V$_{DD}$ 120. The drain terminal of M$_{15}$ 724 is connected to the gate terminal of M$_{14}$ 722. Inverse clock waveform Ck.bar 506 is applied to the gate terminal of M$_{15}$ 724. The skilled artisan will appreciate that M$_{13}$ 720, M$_{14}$ 722, and M$_{15}$ 724 can also be realized in other field effect, junction, or combination transistor technologies. In general, second vertical latch reset switch 708 can be realized in a variety of switch technologies, including microelectromechanical embodiments.

Preferably, second cross connected pair 710 comprises a fifth PMOSFET "M$_{16}$" 726 and a sixth PMOSFET "M$_{17}$" 728, where M$_{16}$ 726 and M$_{17}$ 728 are matched transistors. Preferably, each of M$_{16}$ 726 and M$_{17}$ 728 has a gain greater than one. However, second cross connected pair 710 can function if the product of the individual gains of M$_{16}$ 726 and M$_{17}$ 728 (i.e., the loop gain) is greater than one. The gate terminal of M$_{17}$ 728 is connected to the drain terminal of M$_{16}$ 726 and to the gate terminal of M$_{14}$ 722. The gate terminal of M$_{16}$ 726 is connected to the drain terminal of M$_{17}$ 728 and to the gate terminal of M$_{11}$ 714. The source terminals of M$_{16}$ 726 and M$_{17}$ 728 are together connected to first supply voltage V$_{DD}$ 120. The skilled artisan will appreciate that M$_{16}$ 726 and M$_{17}$ 728 can also be realized in other field effect, junction, or combination transistor technologies.

First vertical latch 702 and second vertical latch 706 act to increase the rate at which the port (i.e., N$_4$ 210 or N$_5$ 212) receiving the current signal (i.e., i$_1$ 218 or i$_2$ 220) that is greater than bias current i$_b$ reaches its new steady state voltage.

For example, when the voltage of Ck 216 is DOWN (i.e., the sampling phase), the states of M$_1$ 206 and M$_2$ 208 are controlled by first and second current signals i$_1$ 218 and i$_2$ 220. If first current signal i$_1$ 218 is greater than bias current i$_b$, first current signal i$_1$ 218 continues to charge the parasitic capacitances at N$_4$ 210, which causes the voltage at N$_4$ 210 to rise. Contemporaneously, when second current signal i$_2$ 220 is less than bias current i$_b$, the parasitic capacitances at N$_5$ 212 start to discharge, which causes the voltage at N$_5$ 212 to drop.

Because the voltage at N$_5$ 212 is also the voltage at the gate terminal of M$_1$ 206, the voltage at the gate terminal of M$_1$ 206 drops by the same amount as the drop in the voltage at N$_5$ 212. Because the voltage at the source terminal of M$_1$ 206 is held at analog ground V$_{AG}$ 118, the gate-to-source voltage of M$_1$ 206 decreases by the same amount as the drop in the voltage at the gate terminal of M$_1$ 206. The decrease in the gate-to-source voltage of M$_1$ 206 causes its drain current to decrease. In response to the decrease in the gate-to-source voltage of M$_1$ 206 and the decrease in its drain current, the drain-to-source voltage of $M_1$ 206 increases by a greater magnitude than the decrease in its gate-to-source voltage.

Meanwhile, because the voltage at $N_4$ 210 is also the voltage at the gate terminal of $M_2$ 208, the voltage at the gate terminal of $M_2$ 208 rises by the same amount as the rise in the voltage at $N_4$ 210. Likewise, because the voltage at $N_4$ 210 is also the voltage at the gate terminal of $M_{10}$ 712, the voltage at the gate terminal of $M_{10}$ 712 rises by the same amount as the rise in the voltage at $N_4$ 210.

Because the voltage at the source terminal of $M_2$ 208 is held at analog ground $V_{AG}$ 118, the gate-to-source voltage of $M_2$ 208 increases by the same amount as the rise in the voltage at the gate terminal of $M_2$ 208. The increase in the gate-to-source voltage of $M_2$ 208 causes its drain current to increase. In response to the increase in the gate-to-source voltage of $M_2$ 208 and the increase in its drain current, the drain-to-source voltage of $M_2$ 208 decreases by a greater magnitude than the increase in its gate-to-source voltage. Likewise, because the voltage at the source terminal of $M_{10}$ 712 is held at analog ground $V_{AG}$ 118, the gate-to-source voltage of $M_{10}$ 712 increases by the same amount as the rise in the voltage at the gate terminal of $M_{10}$ 712. The increase in the gate-to-source voltage of $M_{10}$ 712 causes its drain current to increase. In response to the increase in the gate-to-source voltage of $M_{10}$ 712 and the increase in its drain current, the drain-to-source voltage of $M_{10}$ 712 decreases by a greater magnitude than the increase in its gate-to-source voltage.

Because the voltage at the source terminal of $M_{10}$ 712 is held at analog ground $V_{AG}$ 118, the decrease in the drain-to-source voltage of $M_{10}$ 712 causes the voltage at the drain terminal of $M_{10}$ 712 to drop by the same amount. Because the voltage at the drain terminal of $M_{10}$ 712 is also the voltage at the gate terminal of $M_{11}$ 714, the voltage at the gate terminal of $M_{11}$ 714 drops by the same amount as the drop in the voltage at the drain terminal of $M_{10}$ 712. Because the voltage at the source terminal of $M_{11}$ 714 is held at first supply voltage $V_{DD}$ 120, the drop in the voltage at the gate terminal of $M_{11}$ 714 (i.e., a PMOSFET) causes its source-to-gate voltage to increase by the same amount. The increase in the source-to-gate voltage of $M_{11}$ 714 causes its drain current to increase. In response to the increase in the source-to-gate voltage of $M_{11}$ 714 and the increase in its drain current, the source-to-drain voltage of $M_{11}$ 714 decreases by a greater magnitude than the increase in its source-to-gate voltage.

Because the voltage at the source terminal of $M_2$ 208 is held at analog ground $V_{AG}$ 118, the voltage at $N_5$ 212 drops by the same amount as the decrease in drain-to-source voltage of $M_2$ 208. Thus, the voltage at $N_5$ 212 drops under the relatively small effect of second current signal $i_2$ 220 being less than bias current $i_b$, and the relatively large effect of the decrease in the drain-to-source voltage of $M_2$ 208.

Because the voltage at $N_4$ 210 is also the voltage at the drain terminal of $M_{11}$ 714 and because the voltage at the source terminal of $M_{11}$ 714 is held at first supply voltage $V_{DD}$ 120, the voltage at $N_4$ 210 rises by the same amount as the decrease in the source-to-drain voltage of $M_{11}$ 714. Furthermore, because the voltage at the source terminal of $M_1$ 206 is held at analog ground $V_{AG}$ 118, the voltage at $N_4$ 210 rises by the same amount as the increase in drain-to-source voltage of $M_1$ 206. Thus, the voltage at $N_4$ 210 rises under the relatively small effect of first current signal $i_1$ 218 being greater than bias current $i_b$, the relatively large effect of the increase in the drain-to-source voltage of $M_1$ 206, and the relatively larger effect of the decrease in the source-to-drain voltage of $M_{11}$ 714.

The increasing of the drain-to-source voltage of $M_1$ 206 and the decreasing of the drain-to-source voltage of $M_2$ 208 reinforce each other. The gate-to-source voltage of $M_1$ 206 decreases with the source-to-drain voltage of $M_2$ 208 until $M_1$ 206 is turned OFF.

When $M_1$ 206 is OFF, it does not conduct current. Without drain current, the decreasing of the gate-to-source voltage of $M_1$ 206 no longer effects its drain-to-source voltage. However, the voltage at $N_4$ 210 continues to rise under the relatively small effect of first current signal $i_1$ 218 being greater than bias current $i_b$, and the relatively larger effect of the decrease in the source-to-drain voltage of $M_{11}$ 714 until the parasitic capacitances at $N_4$ 210 are fully charged and the voltage at $N_4$ 210 is HIGH.

It will be recognized that $M_{10}$ 712 and $M_{11}$ 714 form a positive feedback loop that amplifies first current signal $i_1$ 218 and applies an exponentially growing current to the drain terminal of $M_1$ 206. Thus, the parasitic capacitances at $N_4$ 210 are charged under the combined effects of first current signal $i_1$ 218 and the exponentially growing current drawn from first supply voltage $V_{DD}$ 120 by $M_{11}$ 714.

First vertical latch reset switch 704 and second vertical latch reset switch 708 act to reduce the power dissipated by, respectively, first vertical latch 702 and second vertical latch 706 during the reset phase. For example, when the voltage of Ck.bar 718 is DOWN (i.e., the reset phase), $M_{12}$ 716 (i.e., a PMOSFET) connects the gate terminal of $M_{11}$ 714 to first supply voltage $V_{DD}$ 120. With the gate and source terminals of $M_{11}$ 714 connected together, the gate-to-source voltage of $M_{11}$ 714 is made to equal zero, holding $M_{11}$ 714 OFF. This disrupts the latching action of first vertical latch 702 so that cross connected pair 202 can assume a state independent of the state of first vertical latch 702.

However, after the start of the sampling phase, the source-to-gate voltages of $M_{12}$ 716 and $M_{15}$ 724 (i.e., PMOSFETs) can drift to values greater than their threshold voltages such that $M_{11}$ 714 and $M_{14}$ 722 turn ON. Having $M_1$ 206, $M_2$ 208, $M_{10}$ 712, $M_{11}$ 714, $M_{13}$ 720, and $M_{14}$ 722 all ON before the MOSFETs change states can cause latch circuit 700 to draw a large amount of current. Latch circuit 700 acts, in response to first and second current signals $i_1$ 218 and $i_2$ 220, to force one MOSFET of second cross connected pair 710 (e.g., $M_{16}$ 726) ON while the other MOSFET of second cross connected pair 710 (e.g., $M_{17}$ 728) remains OFF. The MOSFET of second cross connected pair 710 (e.g., $M_{16}$ 726) that turns ON connects the gate terminal of its corresponding vertical latch MOSFET (e.g., $M_{14}$ 722) to first supply voltage $V_{DD}$ 120. With the gate and source terminals of the corresponding vertical latch MOSFET connected together, the gate-to-source voltage of the corresponding vertical latch MOSFET is made to equal zero, holding the corresponding vertical latch MOSFET OFF. In this manner, second cross connected pair 710 acts to prevent latch circuit 700 from drawing unnecessary current before the MOSFETs change states during the sampling phase.

For example, when, at the start of the sampling phase, first current signal $i_1$ 218 is slightly larger than bias current $i_b$ (i.e., small positive signal current $i_s$), then first current signal $i_1$ 218 slowly continues to charge the parasitic capacitances at $N_4$ 210, which causes the voltage at $N_4$ 210 to rise slightly. Because the voltage at $N_4$ 210 is also the voltage at the gate terminal of $M_{10}$ 712, the voltage at the gate terminal of $M_{10}$ 712 rises by the same amount as the rise in the voltage at $N_4$ 210.

Because the voltage at the source terminal of $M_{10}$ 712 is held at analog ground $V_{AG}$ 118, the gate-to-source voltage of $M_{10}$ 712 increases by the same amount as the rise in the voltage at the gate terminal of $M_{10}$ 712. The increase in the gate-to-source voltage of $M_{10}$ 712 causes its drain current to increase. In response to the increase in the gate-to-source voltage of $M_{10}$ 712 and the increase in its drain current, the drain-to-source voltage of $M_{10}$ 712 decreases by a greater magnitude than the increase in its gate-to-source voltage. Because the voltage at the source terminal of $M_{10}$ 712 is held at analog ground $V_{AG}$ 118, the decrease in the drain-to-source voltage of $M_{10}$ 712 causes the voltage at the drain terminal of $M_{10}$ 712 to drop by the same amount.

Because the voltage at the drain terminal of $M_{10}$ 712 is also the voltage at the gate terminal of $M_{16}$ 726, the voltage at the gate terminal of $M_{16}$ 726 drops by the same amount as the drop in the voltage at the drain terminal of $M_{10}$ 712.

Because the voltage at the source terminal of $M_{16}$ 726 is held at first supply voltage $V_{DD}$ 120, the drop in the voltage at the gate terminal of $M_{16}$ 726 (i.e., a PMOSFET) causes its source-to-gate voltage to increase by the same amount. The increase in the source-to-gate voltage of $M_{16}$ 726 causes its drain current to increase. In response to the increase in the source-to-gate voltage of $M_{16}$ 726 and the increase in its drain current, the source-to-drain voltage of $M_{16}$ 726 decreases by a greater magnitude than the decrease in its source-to-gate voltage. Because the voltage at the source terminal of $M_{16}$ 726 is held at first supply voltage $V_{DD}$ 120, the decrease in the source-to-drain voltage of $M_{16}$ 726 (i.e., a PMOSFET) causes the voltage at the drain terminal of $M_{16}$ 726 to rise by the same amount.

Because the voltage at the drain terminal of $M_{16}$ 726 is also the voltage at the gate terminal of $M_{14}$ 722, the voltage at the gate terminal of $M_{14}$ 722 rises by the same amount as the rise in the voltage at the drain terminal of $M_{16}$ 726. Because the voltage at the source terminal of $M_{14}$ 722 is held at first supply voltage $V_{DD}$ 120, the rise in the voltage at the gate terminal of $M_{14}$ 722 (i.e. a PMOSFET) causes its source-to-gate voltage to decrease by the same amount.

The decrease in the source-to-gate voltage of $M_{14}$ 722 ensures that it is less than its threshold voltage so that $M_{14}$ 722 is held OFF. Having $M_{14}$ 722 held OFF until first current signal $i_1$ 218 charges the parasitic capacitances at $N_4$ 210 to its new steady state voltage of HIGH prevents latch circuit 700 from drawing unnecessary current during the sampling phase.

For an ADC that incorporates an array of comparators based on latch circuit 700, in which the parameters that define latch circuit 700 (i.e., supply voltages, clock frequency, etc.) had specific values, where the ADC was configured with Exclusive OR gates in the manner of the present invention, simulation showed an improvement in the BER from $10^{-50}$ to $10^{-100}$. Latch circuit 700 is further described in application Ser. No. 10/083,463, filed on Feb. 27, 2002, which is incorporated herein by reference.

Although the present invention is described in relation to comparators realized with current-mode latch circuits, the skilled artisan will appreciate that the teachings of the present invention are not limited to this embodiment. A signal based on any characteristic (e.g., voltage, resistance, etc.) that indicates that a comparator is in a steady state can be used in an embodiment of the present invention to identify a comparator in a metastable condition. Indeed, such a signal need not be the output of the comparator. Therefore, the present invention is not limited to current-mode latch circuit comparator embodiments.

Figure 8:
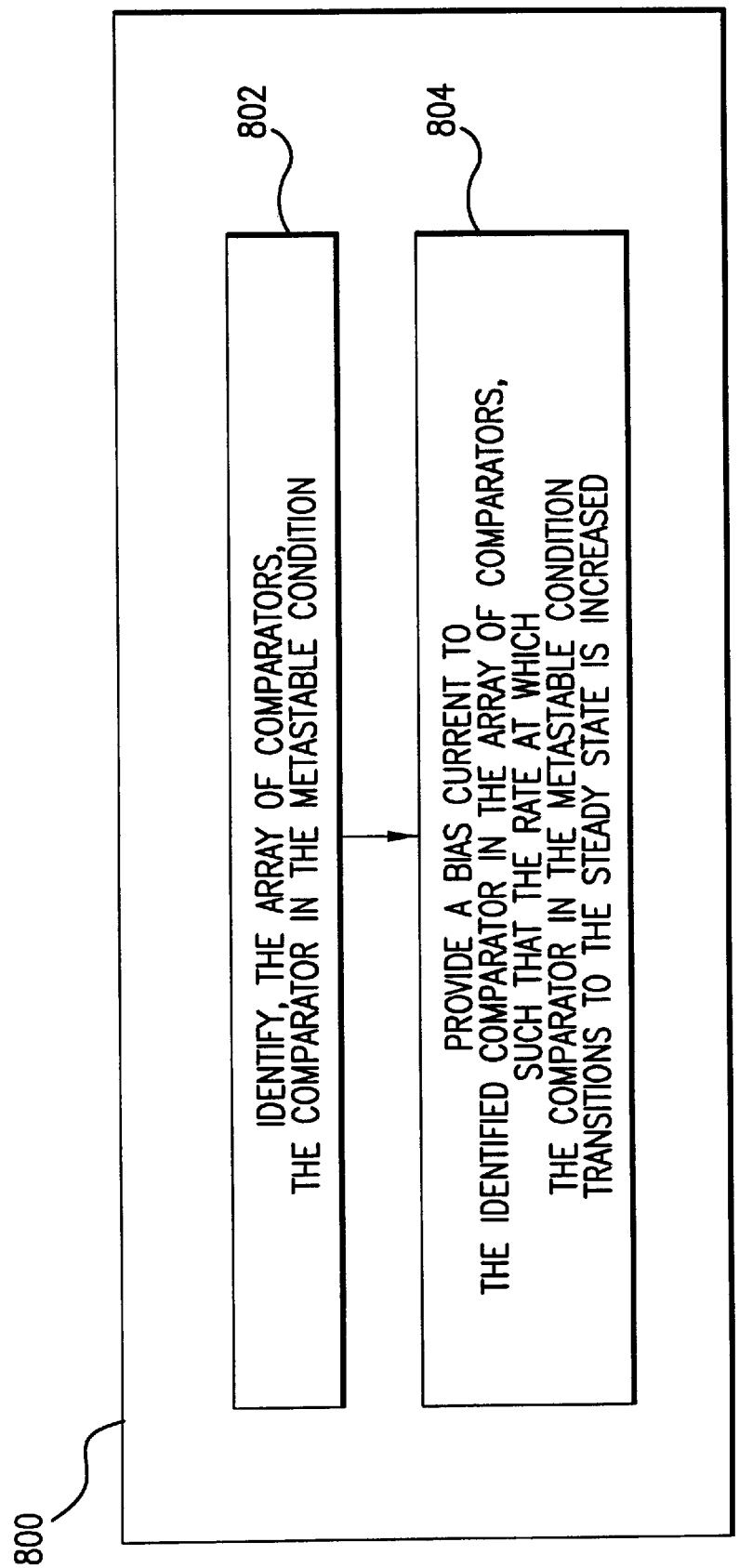
FIG. 8 shows a flow chart of a method 800 for increasing, in an array of comparators, a rate at which a comparator in a metastable condition transitions to a steady state.

FIG. 8 shows a flow chart of a method 800 for increasing, in an array of comparators, a rate at which a comparator in a metastable condition transitions to a steady state. In method 800, at a step 802, the comparator in the metastable condition in the array of comparators is identified. At a step 804, a bias current is provided to the identified comparator in the metastable condition, such that the rate at which the comparator in the metastable condition transitions to the steady state is increased. Preferably, the bias current is provided by controlling a current output from a variable current source that provides the bias current for a latch circuit of the identified comparator in the metastable condition.

To further explain step 802, FIG. 9 shows a flow chart of a preferred method to identify the comparator in the metastable condition. At a step 902, a characteristic of a first comparator of the array of comparators is compared with a characteristic of a second comparator of the array of comparators. The first comparator and the second comparator are separated in the array of comparators by a third comparator in the array of comparators. At a step 904, it is determined if the third comparator is the comparator in the metastable condition based on the compared characteristics. Preferably, the characteristics are compared by receiving the characteristics as inputs to an Exclusive OR gate.

In an embodiment, the bias current is provided by controlling a current output from a variable current source that provides the bias current for a latch circuit of the identified comparator in the metastable condition with an output of an Exclusive OR gate.

In another embodiment, the bias current is provided by connecting a first current source in parallel with a second current source to increase the bias current for a latch circuit of the identified comparator in the metastable condition. Preferably, a switch that connects the first current source in parallel with the second current source is controlled by an output of an Exclusive OR gate.

FIG. 10 shows a flow chart of a method 1000 for increasing, in an array of comparators that includes a first, a second, and a third comparator, a rate at which the third comparator transitions to a steady state. In method 1000, at a step 1002, an output of the first comparator is compared with an output of the second comparator. At a step 1004, a bias current is provided to the third comparator.

In an embodiment, the outputs are compared by receiving the first and second outputs as inputs to an Exclusive OR gate. Preferably, a variable current source that provides the bias current for a latch circuit of the third comparator is controlled based on an output of an Exclusive OR gate.

In another embodiment, the bias current is provided to the third comparator by connecting a first current source in parallel with a second current source to increase the bias current for a latch circuit of the third comparator. Preferably, a switch that connects the first current source in parallel with the second current source is controlled based on an output of an Exclusive OR gate.

Preferably, the bias current is provided by controlling a current output from a variable current source that provides the bias current for a latch circuit of the identified comparator in the metastable condition.

CONCLUSION

While various embodiments of the present invention have been described above, it should be understood that they have been presented by way of example, and not limitation. It will be apparent to persons skilled in the relevant art that various changes in form and detail can be made therein without departing from the spirit and scope of the invention. Thus the present invention should not be limited by any of the above-described exemplary embodiments, but should be defined only in accordance with the following claims and their equivalents.

What is claimed is:

1. An array of comparators, comprising:

a first, a second, and a third comparator;

an Exclusive OR gate having a first input connected to an output of said first comparator and a second input connected to an output of said second comparator; and a variable current source connected to an output of said Exclusive OR gate, said variable current source supplying a bias current to said third comparator.

2. The array of comparators of claim 1, wherein said output of said Exclusive OR gate produces a signal that controls said variable current source.

3. The array of comparators of claim 2, wherein said bias current is increased by said variable current source according to said signal.

4. The array of comparators of claim 1, wherein said third comparator is arranged in the array of comparators between said first comparator and said second comparator.

5. The array of comparators of claim 1, wherein said third comparator comprises a latch circuit configured to receive said bias current.

6. The array of comparators of claim 5, wherein said latch circuit comprises a cross connected pair of transistors connected between a reset switch and a supply voltage, and having a first port capable of receiving a first current signal and producing a first output voltage, and a second port capable of receiving a second current signal and producing a second output voltage.

7. An array of comparators, comprising:

a first, a second, and a third comparator;

an Exclusive OR gate having a first input connected to an output of said first comparator and a second input connected to an output of said second comparator; and a variable current source connected to an output of said Exclusive OR gate, said variable current source supplying a bias current to said third comparator;

wherein:

said third comparator comprises a latch circuit configured to receive said bias current;

said latch circuit comprises a cross connected pair of transistors connected between a reset switch and a supply voltage, and having a first port capable of receiving a first current signal and producing a first output voltage, and a second port capable of receiving a second current signal and producing a second output voltage; and said cross connected pair of transistors comprises:

a first MOSFET; and a second MOSFET connected to said first MOSFET; wherein:

a gate terminal of said first MOSFET is connected to a drain terminal of said second MOSFET;

a gate terminal of said second MOSFET is connected to a drain terminal of said first MOSFET; and source terminals of said first and said second MOSFETs are connected to said supply voltage.

8. The array of comparators of claim 6, wherein said reset switch comprises a MOSFET connected between said first port and said second port.

9. An array of comparators, comprising:

a first, a second, and a third comparator;

an Exclusive OR gate having a first input connected to an output of said first comparator and a second input connected to an output of said second comparator;

a variable current source connected to an output of said Exclusive OR gate, said variable current source supplying a bias current to said third comparator;

a second Exclusive OR gate having an input connected to an output of said third comparator; and a second variable current source connected to an output of said second Exclusive OR gate, said second variable current source supplying a second bias current to said second comparator.

10. An analog to digital converter, comprising:

an array of comparators, having respective inputs configured to receive an analog signal, and respective outputs configured to produce quantized signals responsive to said analog signal;

a priority encoder connected to said array of comparators, configured to produce a digital signal at an output responsive to said quantized signals;

an array of Exclusive OR gates, wherein each Exclusive OR gate of said array of Exclusive OR gates is configured to receive two of said quantized signals; and an array of variable current sources, wherein each variable current source of said array of variable current sources is configured to provide a bias current to a corresponding comparator of said array of comparators, and is controlled by an output of a corresponding Exclusive OR gate of said array of Exclusive OR gates.

11. The analog to digital converter of claim 10, wherein said each Exclusive OR gate of said array of Exclusive OR gates produces a logic signal that controls a corresponding variable current source of said array of variable current sources.

12. The analog to digital converter of claim 10, wherein each comparator of said array of comparators includes a latch circuit configured to receive a corresponding bias current.

13. The analog to digital converter of claim 12, wherein said corresponding bias current is capable of being increased by a corresponding variable current source of said array of variable current sources.

* * * * *